US012731627B2

(12) United States Patent
Chen et al.

(10) Patent No.: US 12,731,627 B2
(45) Date of Patent: Sep. 8, 2026

(54) ACCESS CIRCUIT AND MEMORY CELL CIRCUIT

(71) Applicant: MACRONIX International Co., Ltd., Hsinchu (TW)

(72) Inventors: Wei-Chen Chen, Taoyuan City (TW); Hang-Ting Lue, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 102 days.

(21) Appl. No.: 18/991,735

(22) Filed: Dec. 23, 2024

(65) Prior Publication Data

US 2026/0179673 A1 Jun. 25, 2026

(51) Int. Cl.
*G11C 11/405* (2006.01)

(52) U.S. Cl.
CPC .................................. *G11C 11/405* (2013.01)

(58) Field of Classification Search
CPC .................................................... G11C 11/405
USPC .................................................. 365/149, 154
See application file for complete search history.

(56) References Cited

U.S. PATENT DOCUMENTS 5,239,501 A * 8/1993 Matsui .................... G11C 11/41 365/177
6,061,268 A * 5/2000 Kuo ...................... G11C 11/412 365/156
2001/0030338 A1* 10/2001 Noble .................... H10B 12/00 257/E21.652
2006/0164876 A1 7/2006 Barth et al.
2010/0054057 A1 3/2010 Meterelliyoz et al.
2017/0206969 A1* 7/2017 Lo ...................... G11C 16/0408
2019/0088660 A1* 3/2019 Li ......................... G11C 11/419
2019/0229192 A1* 7/2019 Komagata .......... H10D 30/6706
2021/0272616 A1 9/2021 Giterman et al.

FOREIGN PATENT DOCUMENTS

CN 202549309 U * 11/2012
CN 107393584 A * 11/2017 ........... G11C 11/412
CN 112687308 A * 4/2021
JP 2008052766 A * 3/2008
KR 20150083207 A * 7/2015 ............. H10B 69/00
TW I533306 B 5/2016

OTHER PUBLICATIONS

Fariborz Assaderaghi et al., "Dynamic Threshold-Voltage MOSFET (DTMOS) for Ultra-Low Voltage VLSI", IEEE Transactions On Electron Devices, vol. 44, Mar. 1997, pp. 414-422.
Office Action of counterpart Taiwan application, issued on Oct. 13, 2025, p. 1-P3.

* cited by examiner

*Primary Examiner* — Michael T Tran
(74) *Attorney, Agent, or Firm* — J.C. PATENTS

(57) ABSTRACT

Disclosed are an access circuit and a memory cell circuit. The access circuit includes a first transistor and a second transistor. A first end of the first transistor is coupled to a read bit-line. A second end of the first transistor is coupled to a read source line. A first end of the second transistor is coupled to a write bit-line. A second end of the second transistor is coupled to a gate terminal of the first transistor to serve as the storage endpoint. A gate terminal of the second transistor is coupled to the write word-line. A base terminal of the first transistor is coupled to the gate terminal of the first transistor.

11 Claims, 6 Drawing Sheets

ACCESS CIRCUIT AND MEMORY CELL CIRCUIT

BACKGROUND

Technical Field

The present disclosure relates to a control technology for a memory device, and more particularly to an access circuit and a memory cell circuit for a dynamic random access memory (DRAM).

Description of Related Art

In the field of dynamic random access memory (DRAM) and related technologies, a one-transistor-one-capacitor (1T1C) architecture is typically employed to implement the memory cell circuit within DRAM. This memory cell circuit is susceptible to a reduction in data retention capability due to various factors (such as, but not limited to, data coupling and leakage current). Such factors may potentially result in the loss of stored data.

SUMMARY

The present disclosure provides an access circuit and a memory cell circuit, which effectively enhances the data retention of the memory cell circuit and facilitates the reading of data within the memory cell circuit.

The access circuit of the present disclosure includes a first transistor and a second transistor. The first transistor includes a first end, a second end, a base terminal, and a gate terminal. The first end of the first transistor is coupled to a read bit-line, and the second end of the first transistor is coupled to a read source line. The second transistor includes a first end, a second end, and a gate terminal. The first end of the second transistor is coupled to a write bit-line, and the second end of the second transistor is coupled to the gate terminal of the first transistor to serve as a storage endpoint. The gate terminal of the second transistor is coupled to a write word-line. The base terminal of the first transistor is coupled to the gate terminal of the first transistor.

The memory cell circuit of the present disclosure includes a first transistor, a second transistor, and a capacitor. The first transistor includes a first end, a second end, a base terminal, and a gate terminal. The first end of the first transistor is coupled to a read bit-line, and the second end of the first transistor is coupled to a read source line. The second transistor includes a first end, a second end, and a gate terminal. The first end of the second transistor is coupled to a write bit-line, the second end of the second transistor is coupled to the gate terminal of the first transistor to serve as a storage endpoint, and the gate terminal of the second transistor is coupled to a write word-line. One end of the capacitor is coupled to a reference voltage terminal, and the other end of the capacitor is coupled to the storage endpoint. The base terminal of the first transistor is coupled to the gate terminal of the first transistor.

Based on the foregoing, embodiments of the present disclosure electrically couple the base terminal and the gate terminal of the first transistor (also referred to as the read transistor) in the access circuit or memory cell circuit, thereby enabling the first transistor to operate in a dynamic threshold mode. In the dynamic threshold mode, the first transistor exhibits an improved subthreshold swing (SS) without reducing the off-state leakage current (Ioff). Consequently, when the data corresponding to the memory cell circuit has a specific value (e.g., logical "1"), a larger read current may be obtained, facilitating data reading from the memory cell circuit. In the dynamic threshold mode, the capacitance value of the gate terminal in the first transistor will increase, correspondingly increasing the capacitance value of the storage endpoint in the access circuit or memory cell circuit. Such configuration enhances data retention and mitigates unnecessary coupling effects on the storage endpoint.

DESCRIPTION OF THE EMBODIMENTS

Figure 1:
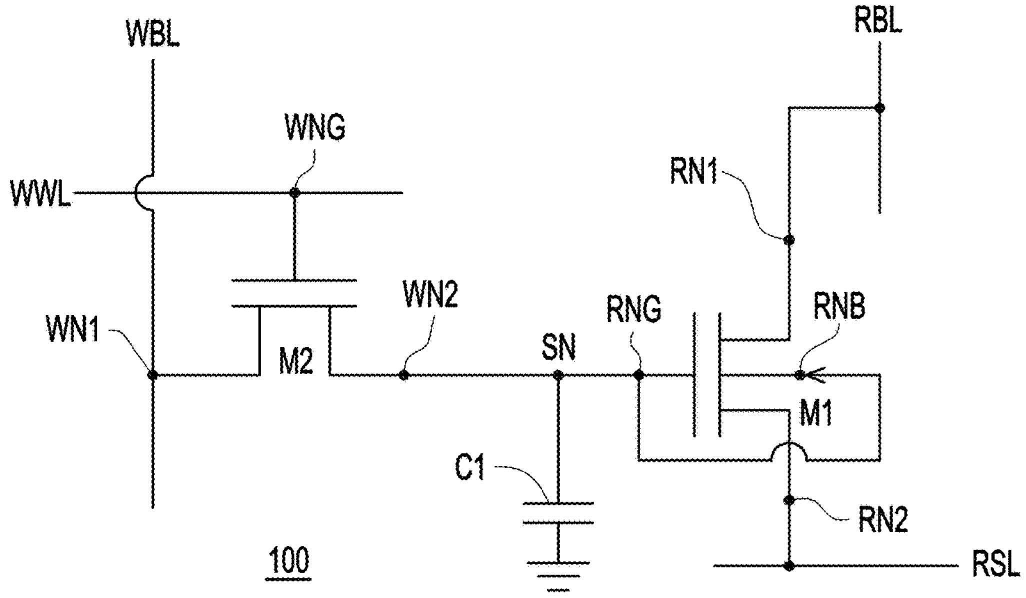
FIG. 1 is a circuit diagram illustrating a memory cell circuit according to the first embodiment of the present disclosure.

FIG. 1 is a circuit diagram illustrating a memory cell circuit 100 according to the first embodiment of the present disclosure. The memory cell circuit 100 may represent individual memory cells and corresponding access circuits in a memory device (such as Dynamic Random Access Memory (DRAM) or embedded Dynamic Random Access Memory (eDRAM)). In this embodiment, the structure of the memory cell circuit 100 may be referred to as a gain cell memory circuit. The memory cell circuit 100 in FIG. 1 may also be referred to as a two-transistor-one-capacitor (2T1C) architecture.

The memory cell circuit 100 primarily includes a first transistor M1, a second transistor M2, and a capacitor C1. In this embodiment, the first transistor M1 and the second transistor M2 are collectively referred to as the access circuit for the memory cell. The capacitor C1 is utilized to stabilize the voltage at the storage endpoint SN, preventing voltage fluctuations at the storage endpoint SN due to coupling effects from other endpoints or signal lines. In alternative embodiments consistent with the present disclosure, the capacitor C1 may be omitted without affecting the overall operation of the memory cell circuit 100 or the access circuit.

The first transistor M1 may be referred to as the read transistor. The first transistor M1 includes a first end RN1, a second end RN2, a base terminal RNB, and a gate terminal RNG. The first end RN1 is coupled to the read bit-line RBL. The second end RN2 is coupled to the read source line RSL. The base terminal RNB of the first transistor M1 is coupled to the gate terminal RNG of the first transistor M1.

The second transistor M2 may be referred to as the write transistor. The second transistor M2 includes a first end WN1, a second end WN2, and a gate terminal WNG. The first end WN1 is coupled to the write bit-line WBL. The second end WN2 of the second transistor M2 is coupled to the gate terminal RNG of the first transistor M1 to serve as the storage endpoint SN. The gate terminal WNG of the second transistor M2 is coupled to the write word-line WWL. One end of the capacitor C1 is coupled to a reference voltage terminal (e.g., ground terminal). The other end of the capacitor C1 is coupled to the storage endpoint SN.

In this embodiment, the voltage of the storage endpoint SN and the base terminal RNB of the first transistor M1, which are tied together, will be lower than the threshold voltage of the PN junction in the first transistor M1. For example, in embedded dynamic random access memory technology, the maximum voltage of the storage endpoint SN and the base terminal RNB is approximately 0.6V, which remains below the forward voltage (e.g., 0.7V) of the PN junction in the first transistor M1.

During the read operation, the memory cell circuit 100 converts the voltage on the storage node SN through the first transistor M1 into a read current flowing between the first end RN1 and the second end RN2 of the first transistor M1, and utilizes this read current to determine the data stored in the storage node SN. In this embodiment, the gate terminal RNG of the first transistor M1 is electrically coupled to the base terminal RNB. As the gate terminal RNG of the first transistor M1 serves as the storage node SN, and the base terminal RNB of the first transistor M1 is coupled to the substrate, it can also be considered that the storage node SN is electrically coupled to the substrate of the first transistor M1.

Whereas the gate terminal RNG of the first transistor M1 is directly electrically coupled to the base terminal RNB, when both the gate terminal RNG and the base terminal RNB of the first transistor M1 are at 0V, the first transistor M1 exhibits a higher threshold voltage Vth. Conversely, when both the gate terminal RNG and the base terminal RNB of the first transistor M1 are at a high voltage (e.g., system voltage Vdd), the first transistor M1 exhibits a lower threshold voltage Vth. In other words, the threshold voltage Vth of the first transistor M1 shall be adjusted correspondingly with the voltage on the storage node SN.

The voltage (e.g., 0.6V) of the storage endpoint SN and the base terminal RNB of the first transistor M1 will be lower than the threshold voltage (e.g., 0.7V) of the PN junction in the first transistor M1. In this embodiment, when the data stored in the storage node SN is logical '1', the voltage at the storage node SN and the voltage at the base terminal RNB is approximately 0.6V, and the first transistor M1 has a lower threshold voltage Vth, thus exhibiting an improved subthreshold swing. Consequently, the voltage drop on the read bit-line RBL occurs more rapidly, facilitating data reading from the memory cell circuit. Conversely, when the data stored in the storage node SN is logical '0', the voltage at the storage node SN and the voltage at the base terminal RNB is approximately 0V, and the first transistor M1 has a higher threshold voltage Vth. As a result, the voltage drop on the read bit-line RBL occurs more slowly. The rate at which the read bit-line RBL voltage drops then determines the state of the storage node SN via a sense amplifier circuit. In other words, a first threshold voltage exhibited by the first transistor M1 when the data stored at the storage endpoint SN is a first value (e.g., one of logical '0' or '1') differs from a second threshold voltage exhibited by the first transistor M1 when the data is a second value (e.g., the other of logical '0' or '1').

Figure 2:
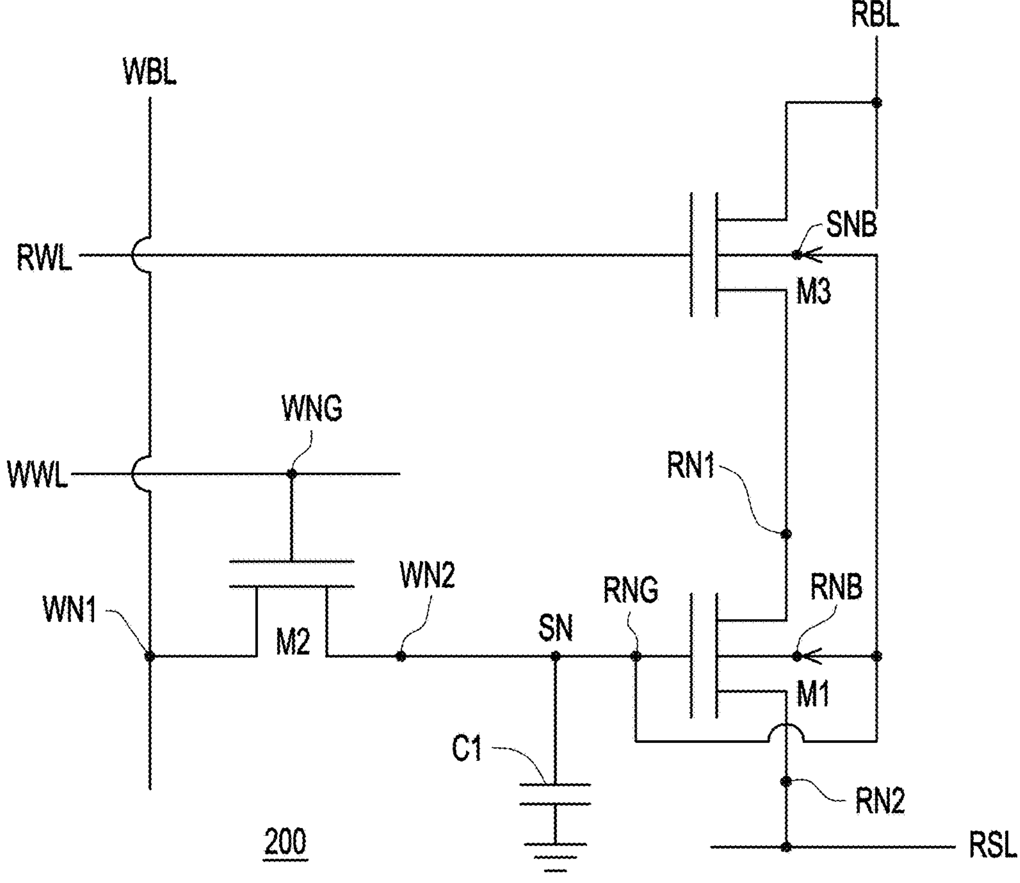
FIG. 2 is a circuit diagram illustrating a memory cell circuit according to the second embodiment of the present disclosure.

FIG. 2 illustrates a circuit diagram of a memory cell circuit 200 according to the second embodiment of the present disclosure. Compared to the memory cell circuit 100 in FIG. 1, the memory cell circuit 200 in FIG. 2 further includes a third transistor. The third transistor M3 may be referred to as a read select transistor, utilized to deactivate unselected memory cell circuits during the read operation. The third transistor M3 is coupled between the first transistor M1 and the read bit-line RBL. Specifically, the first end of the third transistor M3 is coupled to the first end RN1 of the first transistor M1. The second end of the third transistor M3 is coupled to the read bit-line RBL. The gate terminal of the third transistor M3 is coupled to the read word-line RWL.

Figure 3:
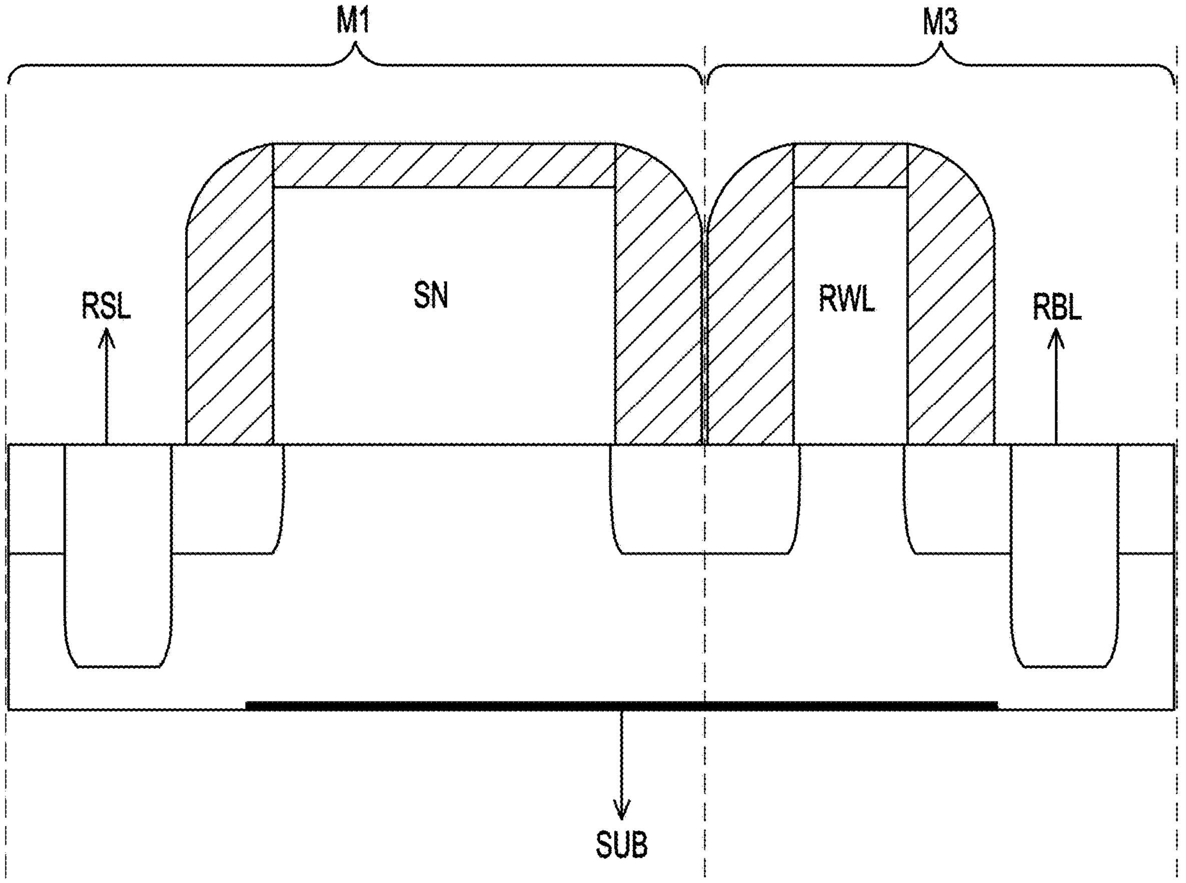
FIG. 3 is a cross-sectional view of the first transistor and the third transistor in the second embodiment of the present disclosure.

FIG. 3 illustrates a cross-sectional view of the first transistor M1 and the third transistor M3 according to the second embodiment of the present disclosure. In this embodiment, the first transistor M1 and the third transistor M3 may be configured on the same substrate SUB, whereby the base terminal SNB of the first transistor M1 is electrically coupled to the base terminal RNB of the third transistor M3. As shown in FIG. 3, the gate terminal of the first transistor M1 is coupled to the storage endpoint SN, the first end of the first transistor M1 is coupled to the first end of the third transistor M3, and the second end of the first transistor M1 is coupled to the read source line RSL. The gate terminal of the third transistor M3 is coupled to the read word-line RWL, and the second end of the third transistor M3 is coupled to the read bit-line RBL.

Applying this embodiment, one may also configure the first transistor M1 and the third transistor M3 of FIG. 1 on different substrates. In other words, the base terminal of the third transistor M3 is not necessarily coupled to the base terminal of the first transistor M1.

Figure 4:
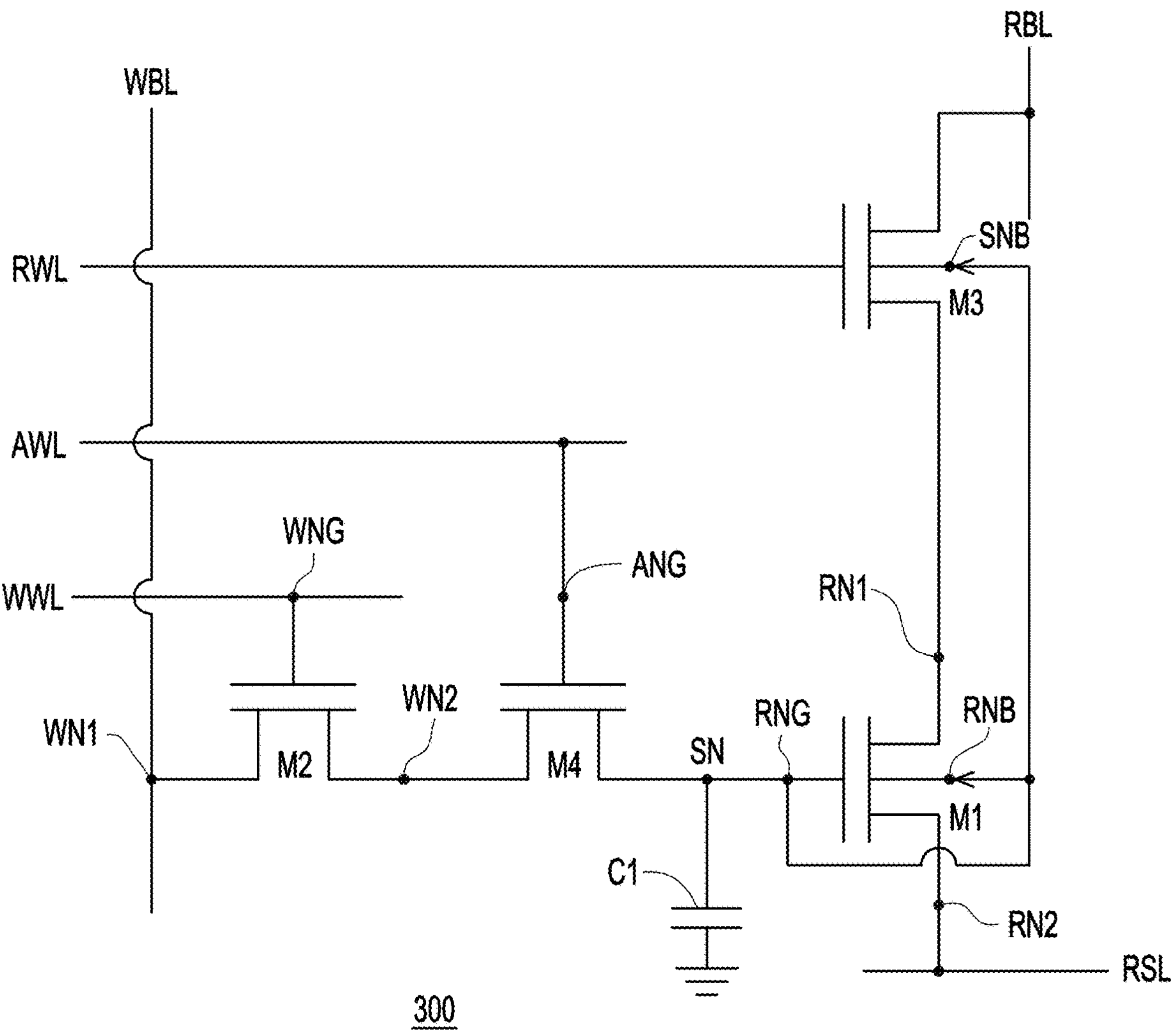
FIG. 4 is a circuit diagram illustrating a memory cell circuit according to the third embodiment of the present disclosure.

FIG. 4 illustrates a circuit diagram of a memory cell circuit 300 according to the third embodiment of the present disclosure. In comparison to the memory cell circuit 200 depicted in FIG. 2, the memory cell circuit 300 in FIG. 3 further includes a fourth transistor M4. The fourth transistor M4 may be referred to as an auxiliary transistor, serving to reduce leakage current at the storage endpoint SN, thereby maintaining data retention. The fourth transistor M4 is coupled between the second transistor M2 and the storage endpoint SN. Specifically, the first end of the fourth transistor M4 is coupled to the second end WN2 of the second transistor M2, the second end of the fourth transistor M4 is coupled to the storage endpoint SN, and the gate terminal ANG of the fourth transistor M4 is coupled to an auxiliary word-line AWL.

Figure 5:
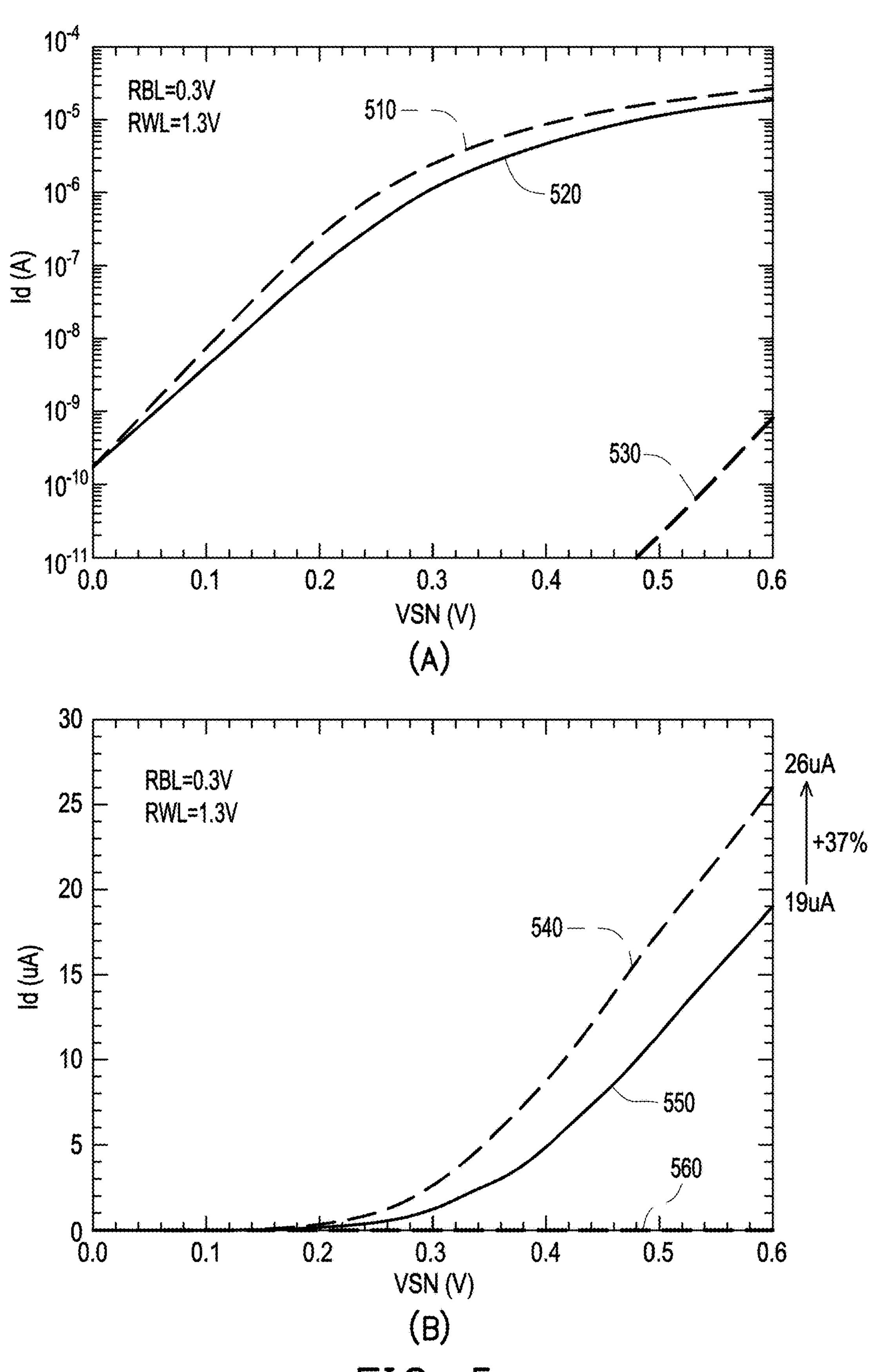
FIG. 5 is a diagram illustrating the current flowing through the first transistor and the voltage at the storage endpoint during the read phase of the memory cell circuit shown in FIG. 4.

FIG. 5 illustrates the relationship between the current Id flowing through the first transistor M1 and the voltage VSN at the storage endpoint SN during the read phase of the memory cell circuit 300 depicted in FIG. 4. The current Id refers to the current flowing between the first end and the second end of the first transistor. The left portion (A) of FIG. 5 demonstrates the relationship between voltage VSN and current Id when the first transistor M1 is in the off state.

Left portion (A) of FIG. 5 illustrates the current Id flowing through the first transistor M1 during the read phase at different voltages VSN. Line segment 510 represents the current Id when the first transistor M1 is in dynamic threshold mode, that is, when the gate terminal RNG of the first transistor M1 is electrically coupled to the base terminal RNB. Line segment 520 represents the current Id when the first transistor M1 is not in dynamic threshold mode, that is, when the base terminal RNB of the first transistor M1 is at 0V and the gate terminal RNG is not electrically coupled to the base terminal RNB. Line segment 530 represents the leakage current Isub in the first transistor M1. In this embodiment, when the voltage VSN at the storage endpoint SN is less than 0.6V, the leakage current Isub is below 1 nA.

Left portion (A) of FIG. 5 depicts the first transistor M1 in an off state. In the case of the dynamic threshold mode, the first transistor M1 is equipped with a smaller threshold voltage, resulting in the line segment 510 exhibiting a lower subthreshold swing (SS) compared to the line segment 520. For instance, the SS of the line segment 510 is approximately 61 mV/second, whereas the SS of the line segment 520 is approximately 72 mV/second. The leakage current Isub represented by the line segment 530 does not impact the sensing of the current Id.

The right portion (B) of FIG. 5 illustrates the relationship between voltage VSN and current Id when the first transistor M1 is in the on state. The right portion (B) of FIG. 5 demonstrates the current Id flowing through the first transistor M1 at different voltages VSN during the read phase. Line segment 540 represents the current Id when the first transistor M1 is in the dynamic threshold mode, specifically when the gate terminal RNG of the first transistor M1 is electrically coupled to the base terminal RNB. Line segment 550 represents the current Id when the first transistor M1 is not in the dynamic threshold mode, specifically when the base terminal RNB of the first transistor M1 is at 0V and the gate terminal RNG is not electrically coupled to the base terminal RNB. Line segment 560 represents the leakage current Isub in the first transistor M1.

In FIG. 5, the right portion (B) depicts the first transistor M1 in an on state. In the case of the dynamic threshold mode, the first transistor M1 is endowed with a lower threshold voltage. Consequently, the rate of increase in current Id along the line segment 540 exceeds the rate of increase in the current Id along the line segment 550. By way of illustration, when the voltage VSN is 0.6V, the current Id in the line segment 540 measures 26 μA, whereas in the line segment 550 the current Id measures 19 μA. As a result, the read margin pertaining to the current Id is enhanced by approximately 37%. The leakage current Isub, as represented by the line segment 560, does not exert any influence on the sensing of the current Id.

On the other hand, the equivalent capacitance on the gate terminal (i.e., the storage endpoint SN) of the first transistor, which is situated in the dynamic threshold mode, will increase due to the electrical coupling between the gate terminal RNG and the base terminal RNB of the first transistor M1. This is because the storage endpoint SN will be electrically coupled to the substrate of the first transistor M1. This configuration is conducive to enhancing data retention and mitigating coupling effects during forward-bias operation.

Figure 6:
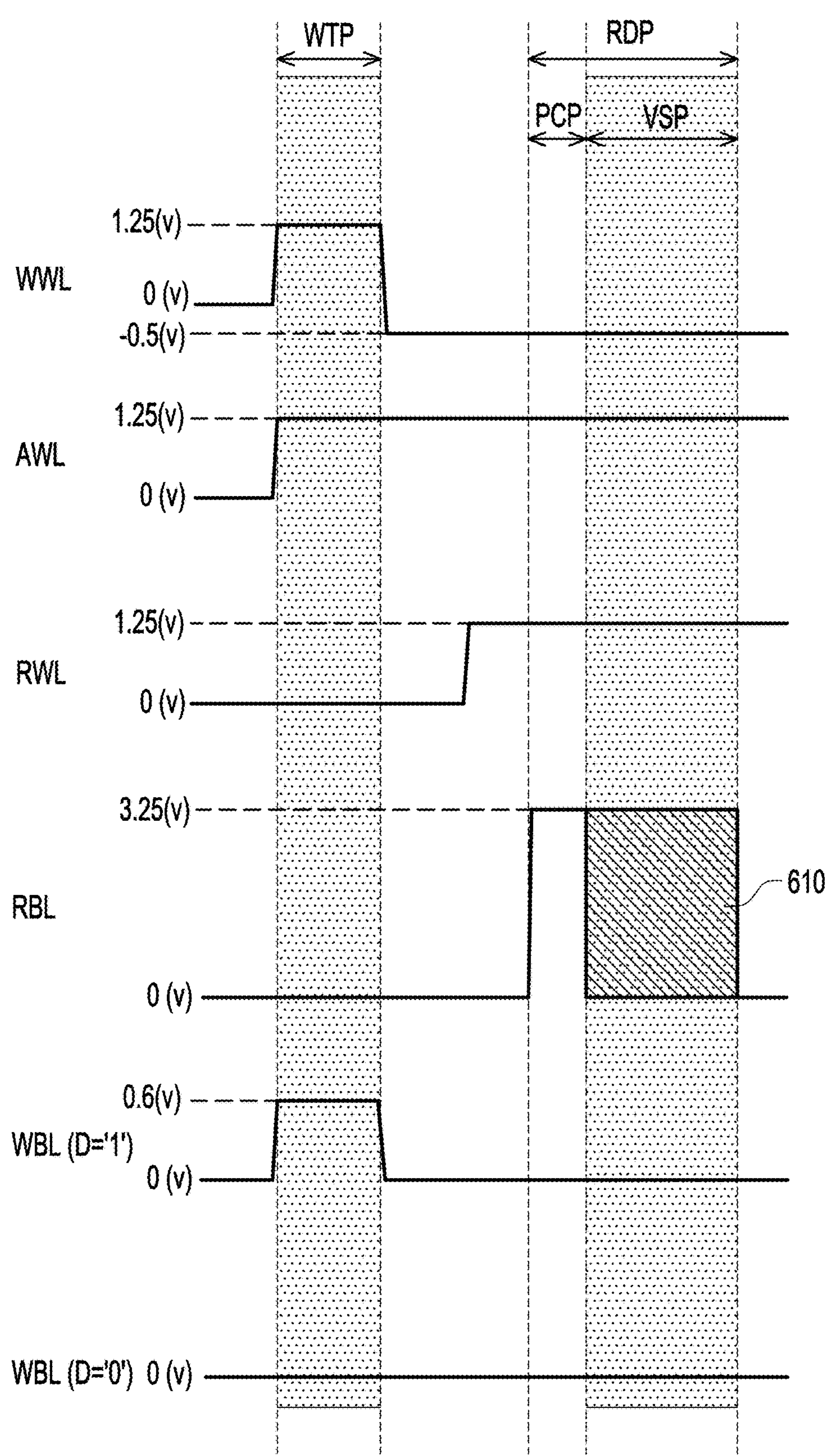
FIG. 6 is a waveform diagram of various signals in the memory cell circuit of FIG. 4 during the write phase and read phase.

FIG. 6 illustrates the waveforms of various signals in the memory cell circuit 300 of FIG. 4 during the write phase WTP and read phase RDP. Please refer to both FIG. 4 and FIG. 6 concurrently. To store data in the storage endpoint SN of the memory cell circuit 300 shown in FIG. 4, it is necessary to execute the write phase WTP. During the write phase WTP, the write word-line WWL and the auxiliary word-line AWL are enabled, thereby rendering the second transistor M2 and the fourth transistor M4 conductive. Subsequently, the data D (e.g., logical '1' or '0') intended for storage in the storage endpoint SN is written in voltage form to the storage endpoint SN.

If one wishes to read data from the storage endpoint SN in the memory cell circuit 300 of FIG. 4, it is necessary to execute a read phase RDP. The read phase RDP includes a precharge phase PCP and a sense phase VSP. During the precharge phase PCP, which precedes the sense phase VSP, the read word-line RWL is enabled, causing the third transistor M3 to enter an on state, and a precharge voltage is applied to the read bit-line RBL. In the subsequent sense phase VSP, the data stored in the storage endpoint SN is determined based on the voltage present on the read bit-line RBL. The waveforms generated in area 610 of FIG. 6 will vary depending on the specific data being read.

Figure 7:
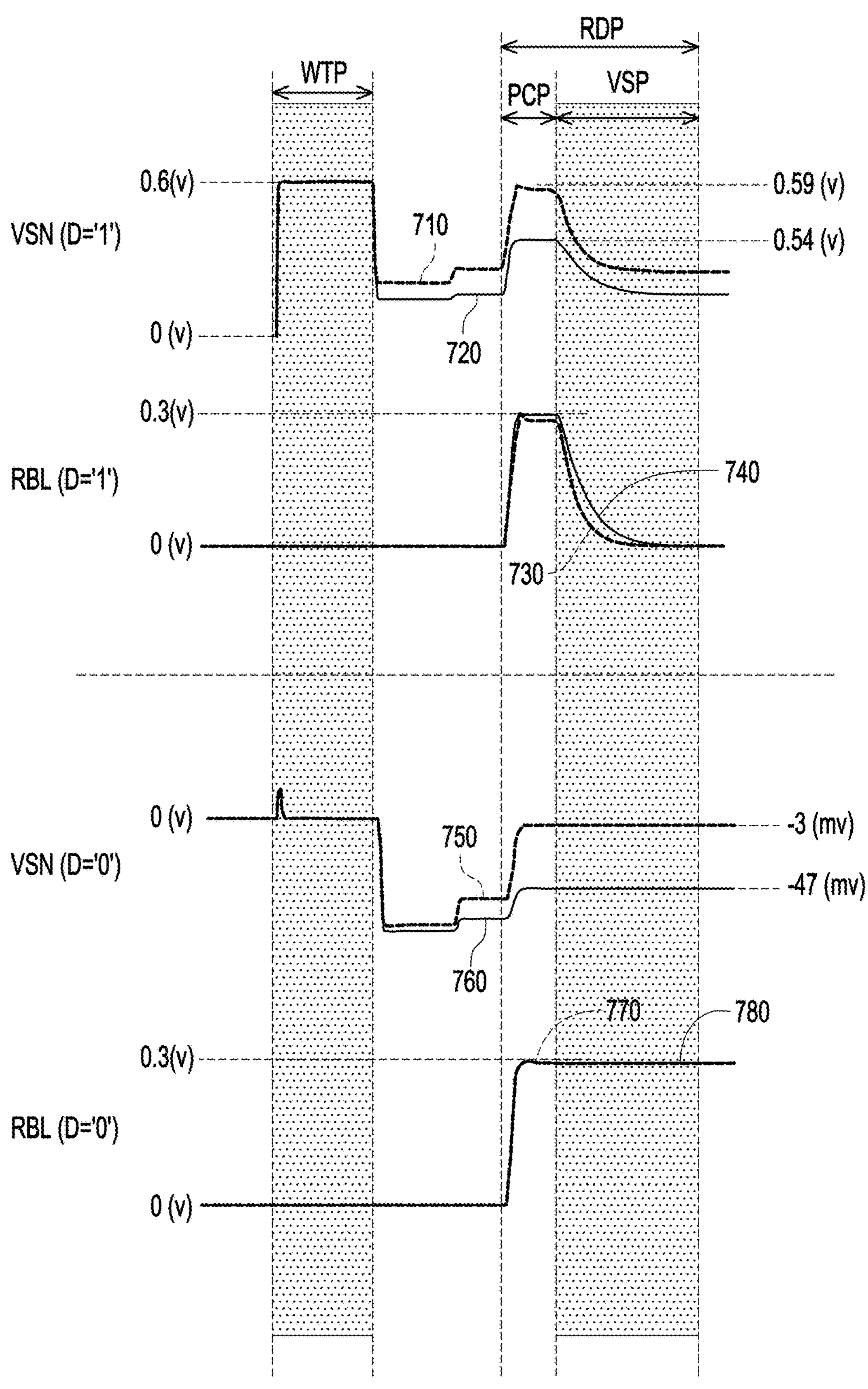
FIG. 7 is a waveform diagram illustrating the voltage on the storage endpoint and the voltage on the read bit-line of the memory cell circuit in FIG. 4 during the read phase.

FIG. 7 illustrates the waveforms of the voltage VSN on the storage endpoint SN and the voltage on the read bit-line RBL during the read phase RDP in the memory cell circuit 300 of FIG. 4. The upper portion of FIG. 7 depicts the voltages on the storage endpoint SN and the read bit-line RBL when the data represents a logical '1'. The waveforms 710 and 730 respectively represent the voltage VSN waveform and the voltage waveform on the read bit-line RBL when the first transistor M1 operates in the dynamic threshold mode. The waveforms 720 and 740 respectively represent the voltage VSN waveform and the voltage waveform on the read bit-line RBL when the first transistor M1 does not operate in the dynamic threshold mode (i.e., when the base terminal of the first transistor is at 0V and the base terminal of the first transistor is not coupled to the gate terminal thereof). As evident from waveforms 710 to 740, the first transistor operating in the dynamic threshold mode exhibits improved subthreshold swing SS, thereby enabling waveforms 710 and 730 to respond more rapidly.

The lower portion of FIG. 7 indicates the voltage VSN on the storage endpoint SN and the voltage on the read bit-line RBL when the data is logical '0'. The waveform 750 and the waveform 770 respectively represent the voltage VSN waveform and the voltage waveform on the read bit-line RBL of the first transistor M1 in dynamic threshold mode. The waveform 760 and the waveform 780 respectively represent the voltage VSN waveform and the voltage waveform on the read bit-line RBL when the first transistor M1 is not in the dynamic threshold mode (i.e., the base terminal of the first transistor is at 0V and the base terminal of the first transistor is not coupled to the gate terminal thereof). As can be observed from the waveforms 750 to 760, the first transistor in the dynamic threshold mode exhibits improved subthreshold swing SS, thus enabling the waveform 750 to respond more rapidly.

In light of the foregoing, embodiments of the present disclosure electrically couples the base terminal and the gate terminal of the first transistor (also referred to as the read transistor) in the access circuit or memory cell circuit, thereby enabling the first transistor to operate in a dynamic threshold mode. In the dynamic threshold mode, the first transistor exhibits improved subthreshold swing without reducing the off-state leakage current (Ioff). Consequently, when the data corresponding to the memory cell circuit is a specific value (e.g., logical "1"), a larger read current may be obtained, facilitating data reading from the memory cell circuit. In the dynamic threshold mode, the capacitance value of the gate terminal in the first transistor will increase, correspondingly increasing the capacitance value of the storage endpoint in the access circuit or memory cell circuit. Such configuration enhances data retention and mitigates unnecessary coupling effects on the storage endpoint.

What is claimed is:

1. An access circuit, comprising:

a first transistor, comprising a first end, a second end, a base terminal, and a gate terminal, wherein the first end of the first transistor is coupled to a read bit-line, and the second end of the first transistor is coupled to a read source line; and a second transistor, comprising a first end, a second end, and a gate terminal, wherein the first end of the second transistor is coupled to a write bit-line, and the second end of the second transistor is coupled to the gate terminal of the first transistor to serve as a storage endpoint, the gate terminal of the second transistor is coupled to a write word-line, wherein the base terminal of the first transistor is coupled to the gate terminal of the first transistor.

2. The access circuit according to claim 1, further comprising:

a capacitor, wherein an end of the capacitor is coupled to a reference voltage terminal, and the other end of the capacitor is coupled to the storage endpoint.

3. The access circuit according to claim 1, further comprising:

a third transistor, coupled between the first transistor and the read bit-line, wherein a first end of the third transistor is coupled to the first end of the first transistor, a second end of the third transistor is coupled to the read bit-line, and a gate terminal of the third transistor is coupled to a read word-line.

4. The access circuit according to claim 3, further comprising:

a fourth transistor, coupled between the second transistor and the storage endpoint, wherein a first end of the fourth transistor is coupled to the second end of the second transistor, a second end of the fourth transistor is coupled to the storage endpoint, and a gate terminal of the fourth transistor is coupled to an auxiliary word-line.

5. The access circuit according to claim 1, wherein a first threshold voltage exhibited by the first transistor when a data at the storage endpoint is a first value differs from a second threshold voltage exhibited by the first transistor when the data is a second value.

6. The access circuit according to claim 1, wherein a voltage of the storage endpoint and the base terminal of the first transistor is lower than a threshold voltage of a PN junction in the first transistor.

7. A memory cell circuit, comprising:

a first transistor, comprising a first end, a second end, a base terminal, and a gate terminal, wherein the first end of the first transistor is coupled to a read bit-line, and the second end of the first transistor is coupled to a read source line;

a second transistor, comprising a first end, a second end, and a gate terminal, wherein the first end of the second transistor is coupled to a write bit-line, the second end of the second transistor is coupled to the gate terminal of the first transistor to serve as a storage endpoint, and the gate terminal of the second transistor is coupled to a write word-line; and a capacitor, wherein an end of the capacitor is coupled to a reference voltage terminal, and the other end of the capacitor is coupled to the storage endpoint, wherein the base terminal of the first transistor is coupled to the gate terminal of the first transistor.

8. The memory cell circuit according to claim 7, further comprising:

a third transistor, coupled between the first transistor and the read bit-line, wherein a first end of the third transistor is coupled to the first end of the first transistor, a second end of the third transistor is coupled to the read bit-line, and a gate terminal of the third transistor is coupled to a read word-line.

9. The memory cell circuit according to claim 8, further comprising:

a fourth transistor, coupled between the second transistor and the storage endpoint, wherein a first end of the fourth transistor is coupled to the second end of the second transistor, a second end of the fourth transistor is coupled to the storage endpoint, and a gate terminal of the fourth transistor is coupled to an auxiliary word-line.

10. The memory cell circuit according to claim 7, wherein a first threshold voltage exhibited by the first transistor when a data at the storage endpoint is a first value differs from a second threshold voltage exhibited by the first transistor when the data is a second value.

11. The memory cell circuit according to claim 7, wherein a voltage of the storage endpoint and the base terminal of the first transistor is lower than a threshold voltage of a PN junction in the first transistor.

* * * * *